United States Patent
Abadir et al.

(10) Patent No.: US 7,003,743 B2
(45) Date of Patent: Feb. 21, 2006

(54) METHOD AND SYSTEM OF DATA PROCESSOR DESIGN BY SENSITIZING LOGICAL DIFFERENCE

(75) Inventors: Magdy S. Abadir, Austin, TX (US); Andreas Veneris, Toronto (CA)

(73) Assignee: Freescale Semiconductor, Inc., Austin, TX (US)

( * ) Notice: Subject to any disclaimer, the term of this patent is extended or adjusted under 35 U.S.C. 154(b) by 376 days.

(21) Appl. No.: 10/061,581

(22) Filed: Feb. 1, 2002

(65) Prior Publication Data

US 2003/0149945 A1 Aug. 7, 2003

(51) Int. Cl.
*G06F 17/50* (2006.01)

(52) U.S. Cl. .................. 716/4; 716/2; 716/17
(58) Field of Classification Search .............. 716/2, 716/4, 6, 17, 18, 3, 5, 14; 703/14; 714/738, 714/725; 702/119
See application file for complete search history.

(56) References Cited

U.S. PATENT DOCUMENTS

| | | | | |
|---|---|---|---|---|
| 5,243,603 A | * | 9/1993 | Broeren ...................... | 714/738 |
| 5,920,830 A | * | 7/1999 | Hatfield et al. ............. | 702/119 |
| 6,301,687 B1 | * | 10/2001 | Jain et al. ..................... | 716/3 |
| 6,324,679 B1 | * | 11/2001 | Raghunathan et al. ........ | 716/18 |
| 6,336,205 B1 | * | 1/2002 | Kurokawa et al. ............. | 716/2 |
| 6,694,464 B1 | * | 2/2004 | Quayle et al. .............. | 714/725 |
| 6,785,873 B1 | * | 8/2004 | Tseng ............................ | 716/4 |
| 2002/0016952 A1 | * | 2/2002 | Chang et al. .................. | 716/18 |

OTHER PUBLICATIONS

Design Rewiring Based on Diagnosis Techniques.
Design Error Diagnosis & Correction Via Test Vector Simulation, Dec. 1999.
Multi–Level Logic Optimization for Low Power using, etc., 1996.
Gate–Levels Synthesis for Low–Power, etc., 1996.
Layout Driven Logic Synthesis for FPGAs, 1994.
Logic Clause Analysis for Delay Optimization, 1995.
Introduction of Permissible Bridges with Application, etc., 1994.
Logic Optimization and Equivalence Checking, etc., 1997.
Combinational and Sequential Logic Optimization, etc., 1995.

* cited by examiner

*Primary Examiner*—Thuan Do
(74) *Attorney, Agent, or Firm*—Toler, Larson & Abel, LLP

(57) ABSTRACT

A method of optimizing a design is disclosed, wherein a target element contributing to an undesirable characteristic in an original netlist is modified to create a modified netlist. A set of test vectors identifying differences between the original netlist and the modified netlist is identified and used to identify a set of corrections. In one disclosed embodiment, the set of corrections is identified by using an error correction algorithm. Each correction of the set of corrections, when applied to the modified netlist, results in a corrected netlist logically the same as the original netlist. One of the corrections is selected that improves the error characteristic of the original netlist. A final equivalency verification is performed as necessary.

35 Claims, 6 Drawing Sheets

METHOD AND SYSTEM OF DATA PROCESSOR DESIGN BY SENSITIZING LOGICAL DIFFERENCE

FIELD OF THE DISCLOSURE

The present invention relates generally to designing of data processing devices, and more specifically to the design optimization and verification of data processing devices.

BACKGROUND

The need to make optimizing changes to the design of a data processing device for the purpose of correcting or improving a characteristic of the device is well known. In addition, it is often desirable for such a change to not affect the logical functionality of the device. For example, it may be desirable to change a particular design implementation that is correct logically because it has a logic portion that demonstrates an undesirable characteristic, such as occupying too much area, consuming too much power, contributing to a timing failure (i.e. a propagation delay error and race conditions), or contributing too much noise.

One known optimization technique used to optimize portions of a design is a redundant addition/removal method. An addition/removal method corrects undesirable characteristics associated with a target portion of a device by first adding and then removing redundant logic. More specifically, the addition/removal method includes adding logic that is redundant in presence of the target portion of the design, where the target portion of a design is that portion that demonstrates or contributes to the characteristic to be optimized. This addition of redundant logic is accomplished by adding a new gate with support for existing nodes of the design, or by adding an additional fan-in to an existing gate to accommodate a redundant feature. During each iteration of this technique, some simple redundant logic is added in the design so that the target logic becomes redundant. Once the desired optimization constraints are met by the addition of a redundant logic portion, the target portion can be removed.

While the addition/removal method can be used to identify redundancies that can replace simple design portions, such as specific wires, the addition/removal methods are limited to identifying corrections that are redundant with the target element being replaced. Therefore, a method and/or system that could optimize more complex design portions as well as identifying replacement logic that is not redundant would be useful.

BRIEF DESCRIPTION OF THE DRAWINGS

Various display objects, advantages, features and characteristics of the present disclosure, as well as methods, operations and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

A new method for optimization of a logic device that uses a logic removal/addition technique is disclosed. The method uses a remove/add technique that first attempts to introduce an error by removing a target element that contributes to an undesirable design characteristic, and subsequently identifies one or more modifications that may be used to improve the undesirable characteristic. The newly disclosed method is advantageous over the known art, in that by removing the target element prior to determining replacement logic it is possible to more efficiently use the don't care states within a design to identify a more robust set of possible replacement logic. For example, replacement elements that are not redundant with the target element are included in the set of possible replacements. In addition, the present method allows for the replacement of more complicated target elements than previously known methods. Note that if removal of a target element introduces no error, the target element was redundant to begin with and no change is needed. However, typically, as assumed herein, the target element will introduce errors relative to the logical functionality of the original netlist. Specific implementations of the present invention are further disclosed with respect to the illustrations of FIGS. 1–10.

Prior to specifically discussing the figures, it will be useful to clarify a few terms as used herein. The term "node" is used herein to identify one or more conductive traces, or wires, that are connected together and provide a common electrical signal between two or more devices. The term "wire" is used herein to identify a portion of a node that causes the input of a specific device to be electrically connected to a node. For example, a node that connects the output of one device to multiple inputs is considered to have multiple wires, generally one to each input. The term "test vector" is used herein to identify one or more input vectors and their corresponding output vectors that are used to verify a functionality of at least a portion of design at its outputs.

Figure 1:
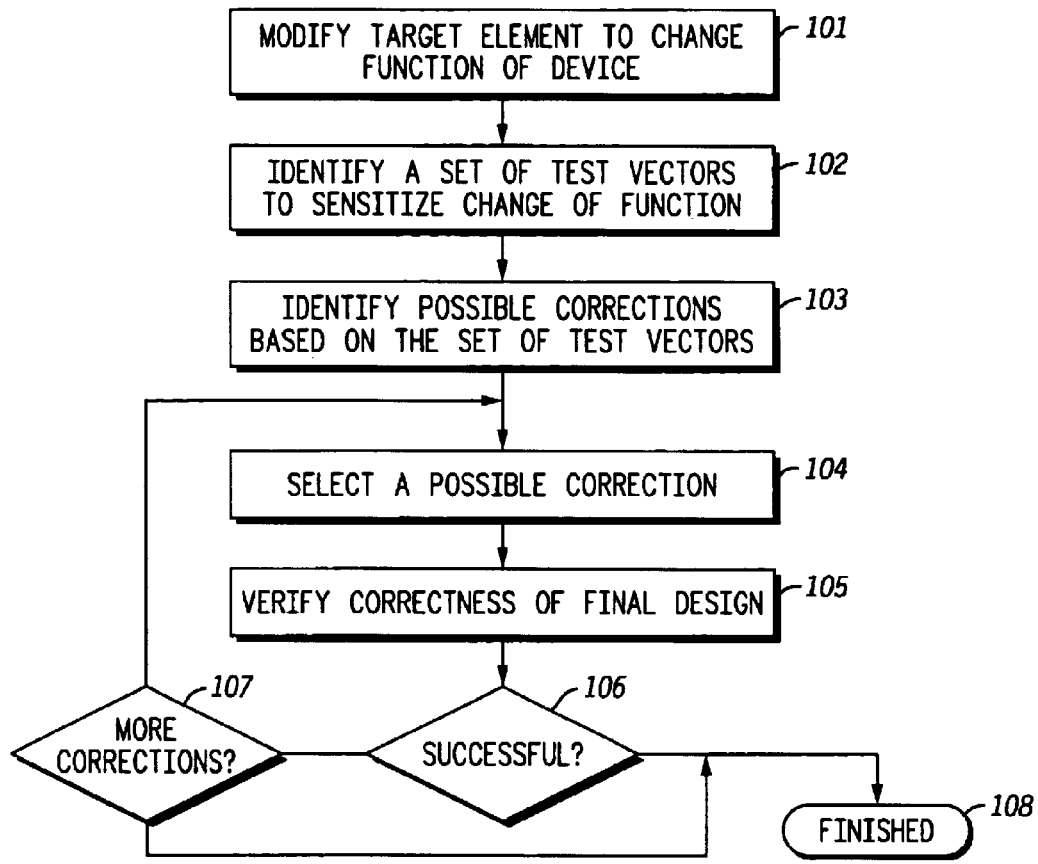
FIG. 1 illustrates a method in accordance with a specific embodiment of the present invention.

FIG. 1 illustrates a method in accordance with a specific embodiment of the present invention. At step 101 of FIG. 1 a target element of an original design is modified to change the functionality of a device. Generally, the target element is a specific wire, node, or logic portion of a design that exhibits a characteristic that needs to be optimized. In one embodiment, the modification of step 101 consists of the removal of the target device from the design to create a modified design. In another embodiment, the target element can be replaced with one or more different logic elements. In different embodiments, the target element can be a specific wire, node, or logic device. Further discussion and examples of a target device and how it can be modified will be discussed in greater detail herein.

At step 102 of FIG. 1, the original and modified designs are used to identify a set of differential test vectors that sensitize the functional differences between the original design, which includes the target element, and the modified design, which includes the modified target element. In a specific embodiment, the set of differential test vectors provides observable results that highlight functional differences between the original and modified designs. In affect, the differential test vectors identify specific logic states of the modified design that are in error relative to the logic states of the original design. Specific methods of determining the set of differential test vectors are discussed in greater detail herein.

At step 103, a set of possible corrections is determined based upon the set of differential test vectors. The step of identifying possible corrections generally includes a diagnosis analysis to determine where the source of an error may have originated within a design, and a correction analysis to determine possible corrections for the likely error sources.

Structured methods or dictionary methods can be used to diagnosis the source of the correction step 103. Dictionary methods, or Full Dictionary methods as they are also known, suggest one or more a possible error locations within a design by using a dictionary that includes a complete, or near complete, cross reference of error states to error sources. The dictionary can be determined by introducing one or more various errors to a design, simulating the design, and recording the failed output vectors that result. This process is completed until the dictionary is deemed complete. Once complete, the dictionary can be used to cross reference the error states of the differential test vectors 225 to the source errors of the dictionary.

Structured methods can also be used to identify the source of errors and generate possible corrections based on the differential test set 225. As is know in the art, structured methods analyze a design's structure to determine where an observable error may have been introduced. Such structured methods generally use path mapping techniques which start at the output(s) where an error is known to have occurred, and map the signal back through the design to determine where the error may have been introduced. One class of structured methods for determining the location of manufacturing errors is employed by (Automatic Test Program Generator) ATPG tools, which are used to identify manufacturing errors. Examples of manufacturing errors capable of being identified and corrected by such tools include stuck-at and bridging faults. Once such an error location is determined, the tools generally provide data used to implement suggested changes.

In another embodiment, a design error diagnosis and correction tool can be used in addition to, or in place of a manufacturing error diagnosis correction tool. As is known in the art, design error tools differ from manufacturing error tools in that, manufacturing error tools assume that the actual design is correct, and are limited to looking for errors that are typically introduced during the manufacture of a device. Design error tools, however, work from the assumption that the design may have actual design errors that may be contributing to an erroneous result. Examples of design errors that can be detected by current design error diagnosis tools are extra and missing inversions, incorrectly placed wires, extra and missing gates, extra and missing wires, and improper gate type selection.

Once the diagnosis portion of the error correction module identifies a possible error location, a correction for the location is suggest and verified for logical functionality with the remainder of the specification. The diagnosis continues, generally using a mapping method, to determine if other possible error sources exist. In this manner design error tools attempt to diagnose and correct a design error by using the assumption that one or more or these design errors may have been introduced during the design process. Various design error detection and correction methods and implementations have been proposed beginning with a paper by M. S. Abadir, J. Ferguson, and T. E. Kirkland, "Logic verification via test generation", in IEEE Trans. Computer-Aided Design, vol. 7, pp. 138–148, January 1988, and continuing with a paper by Veneris and Hajj, "Design Error Diagnosis and Correction Via Test Vector Simulation", in IEEE Trans. on Computer-Aided Design, vol. 18, no. 12, pp. 1803-18-16, December 1999.

At step 104, one of the corrections in the set of possible corrections is selected to create a corrected design. As part of the selection process, the selected correction analyzed to verify that the correction properly optimizes the original design. For example, if the target element contributed to a speed path error, the selection process would verify that the selected correction meets or improves upon the speed path of the original device. Under certain circumstances, which are discussed in greater detail herein, it is possible that the selected correction will not produce a device having the same logical functionality as the original test vector. Therefore, step 105 verifies logical equivalency of the modified design to corrected design to the original design. At step 106, if the optimization processes has been successful the flow finishes at step 108. However, if the optimization process has not been successful, the flow proceeds to step 107.

At step 107, a determination is made whether there are additional corrections that can be selected. If so, the flow proceeds to step 104 for further processing. If no additional corrections are to be made, the flow finishes at step 108.

It will be appreciated that the method illustrated in FIG. 1 is different from known optimization methods in that an error is intentionally introduced at a know location, near where an optimization is to occur, prior to an analysis used to determine possible corrections.

Figure 2:
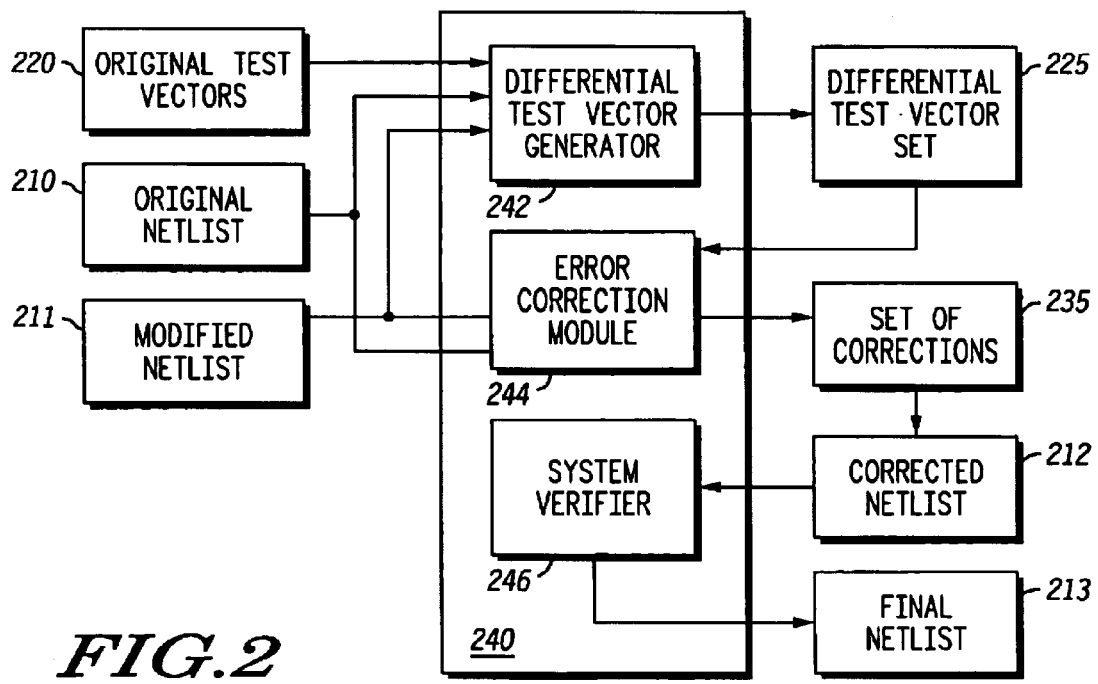
FIG. 2 illustrates, in block diagram form, a system for optimizing the design of a data processing device in accordance with a specific embodiment of the present invention.

FIG. 2 represents one embodiment of a system 240 that can be used to implement various embodiments of the present invention. The system 240 includes a differential test vector generator module 242, an error correction module 244, and a system verifier 246. Initial inputs available to the system 240 include original netlist 210, original test vectors 220, and original test vectors 220. It will be appreciated that the term netlist generally applies to a non-graphical representation of a design that provides information about the components of a design and the connectivity of those components. While netlists are specifically shown in FIG. 2, it will be appreciated that any design representations, including RTL (resistor transistor logic), and physical design descriptions, capable of being processed by the system 240 can be used.

Figure 3:
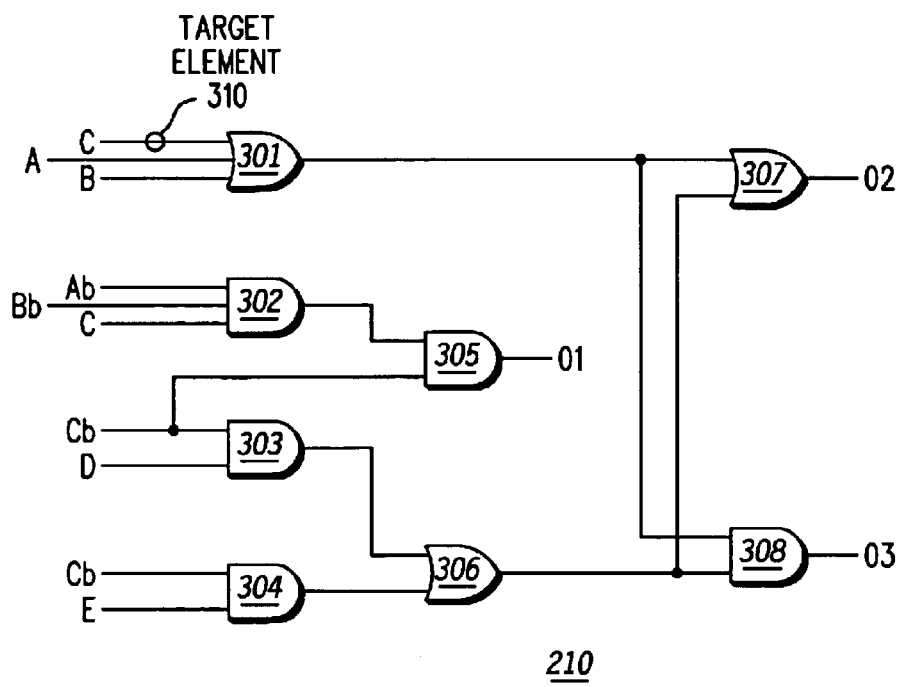
FIG. 3 illustrates a logic circuit to be optimized by the method and system of FIGS. 1 and 2.

The original netlist 210 represents a design that is logically correct, but has been identified as needing to be optimized to improve one or other characteristics associated with a target portion of the design. Examples of specific characteristics that can be optimized include area, power consumption, timing, noise, and testability. For purposes of discussion, FIG. 3 illustrates a graphical representation of the original design of netlist 210. Specifically, the design represented by FIG. 3, includes: three input OR gate 301 that receives signals C, A, and B; three input AND gate 302 that receives signals Ab, Bb, and C, (Note that signal Ab represents a state that is inverted from the state of signal A, and likewise signal Bb represents a state that is inverted from the state of signal B); two input AND gate 303 that receives signals Cb and D; two input AND gate 304 that receives signals Cb and E; two input AND gate 305 that is coupled to the output of gate 302 and also receives signal Cb; two input OR gate 306 that is connected to the output of gates 303 and 304; two input OR gate 307 that is connected to the outputs of gates 301 and 306; and two input AND gate 308 that is connected to the outputs of gates 301 and 306. In one implementation, the wire providing the signal C to the gate 301 is the target element to be modified.

It will be appreciated that the design represented by the original netlist 210 has an inherent logical functionality that is based upon its components and how they are connected. In addition, the design represented by the original netlist has a verified logical functionality which is that portion of the inherent logical functionality that has been verified by original test vectors 220. The original test vectors 220 represents simulation vectors that have been used, or can be used, to verify certain logical functionality of a design. It is often not practical to have a set of test vectors, i.e. original test vectors 220, that test every possible aspect of a design (its inherent functionality). Instead, a set of simulation test vectors is generally used that is believed to sufficiently test the design (verified functionality).

Figure 4:
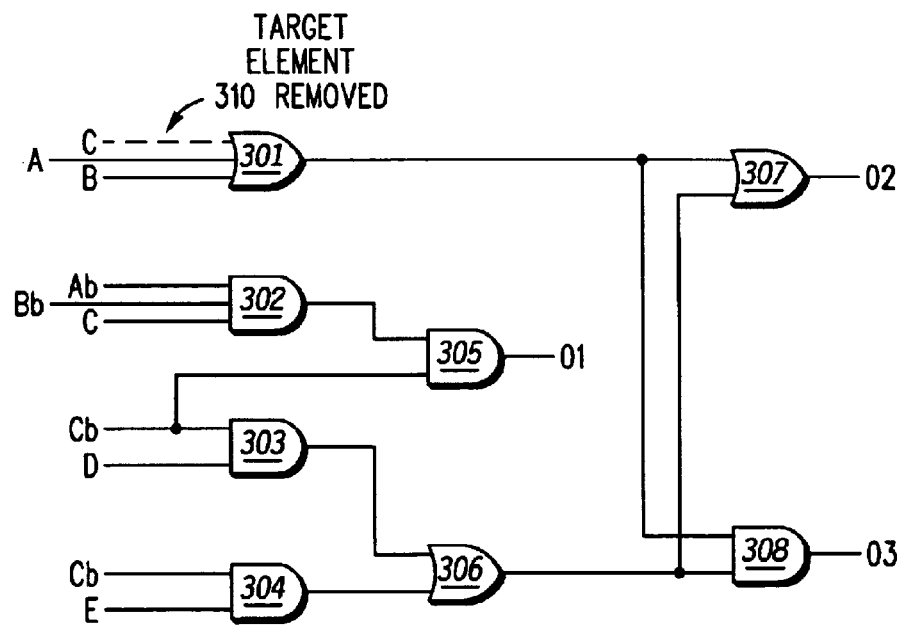
FIG. 4 illustrates a logic circuit modifying a target element that is to be optimized.

The modified netlist 215 of FIG. 2 represents a modified version of the original netlist 210. Specifically, a target element has been modified in the modified netlist 215 to introduce a logical error. For example, FIG. 4 illustrates the modified netlist of FIG. 4 as a graphical representation of the modified netlist 215, whereby the target element, the wire providing the signal C to the gate 301, has been modified by its removal from the design. Modifying a design first in an optimization process is different from the addition/removal method of the prior art which does not remove the target component until later.

Figure 5:
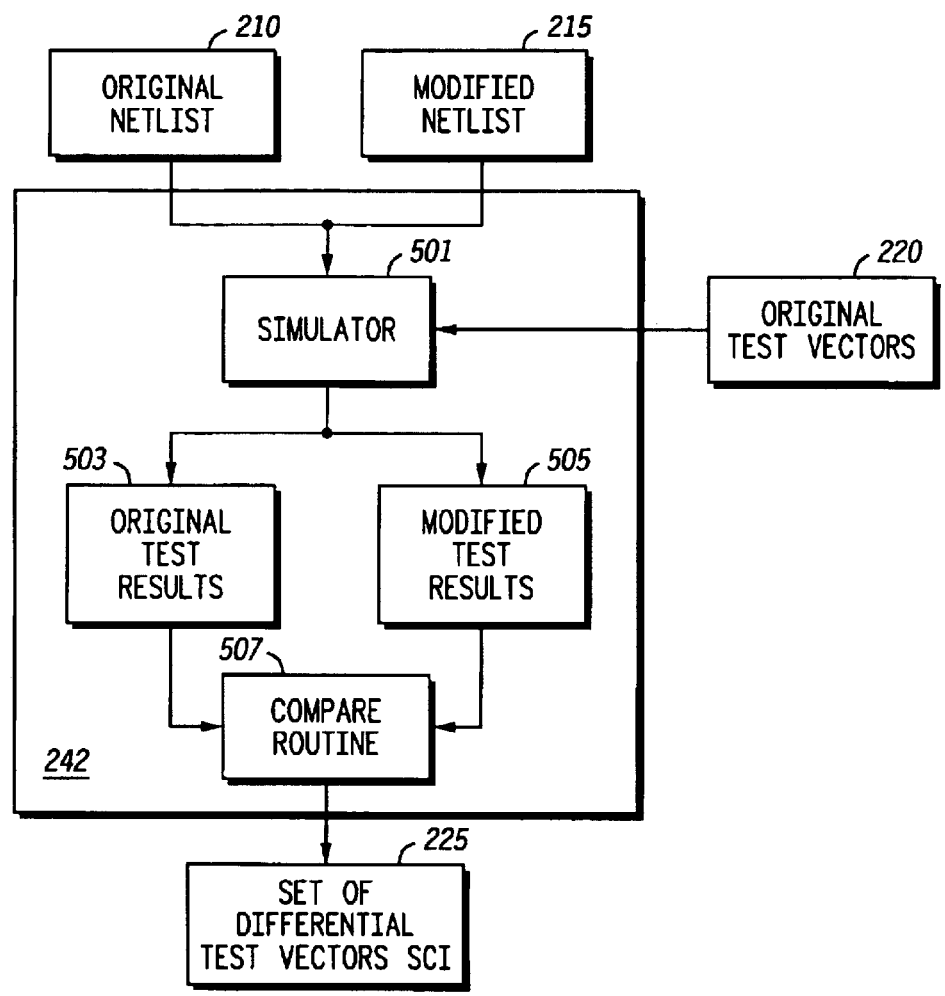
FIG. 5 illustrates a specific embodiment of the differential test vector generator illustrated in FIG. 2.

After the target element has been modified, the differential test vector generator 242 operates to determine a set of test vectors that sensitize logical differences between the original netlist and the modified netlist. These test vectors that sensitize logical differences are referred to as differential test vectors. FIG. 5 illustrates one embodiment of the differential test vector generator 242. Specifically, simulator 501 uses the original test vectors 220 to derive output vectors 503 and 505 based on the original netlist 210 and the modified netlist 215 respectively. The output vectors 503 and 505 are compared by routine 507 to determine a set of differential test vectors 225, which are the test vectors in the set of original test vectors that sensitize the logical differences of the original and modified netlists.

In another embodiment, instead of using the original test vectors 220 to drive the simulator 501, randomly generated test vectors can be used to identify differential test vectors 225. In yet another embodiment, the differential test vectors 225 can be determined using ATPG techniques, in the manner discussed with reference to FIG. 8 herein.

Figure 6:
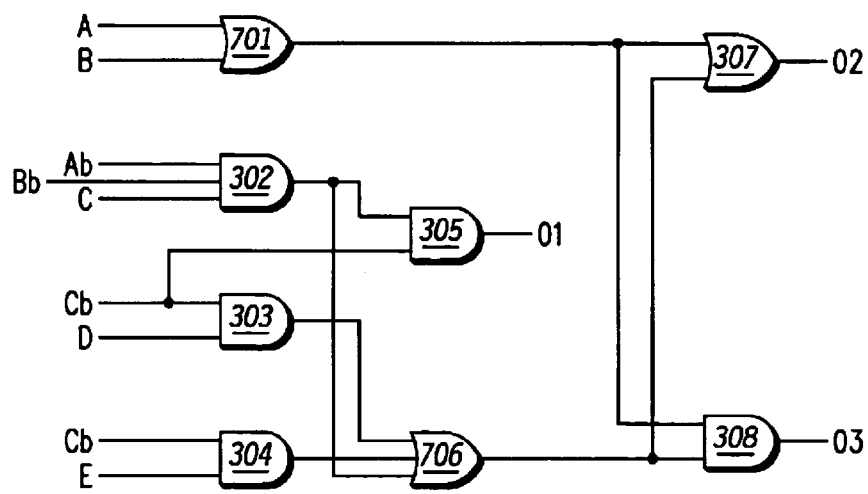
FIG. 6 illustrates a corrected logic circuit based on the logic circuit of FIG. 4.

Once the set of differential test vectors 242 has been identified, they are used by the error correction module 244 to identify one or more corrections which may optimize the design in a desired manner. In the context of design optimization, a correction is a design change that when applied to the modified netlist 211 creates a corrected netlist having a logical functionality that is the same as a specified functionality of the original netlist. For example, the original and corrected design provide the same logical outputs given a set of test vectors, which includes the differential test vectors. For example, FIG. 6 illustrates one possible correction for the modified netlist 211 of FIG. 5. Specifically, the circuit of FIG. 6 differs from the modified netlist 211 of FIG. 5 in that the three input OR gate 301 (FIG. 4) has been replaced by a 2 input OR gate 701 (FIG. 6), and two input OR gate 306 (FIG. 4) has been replace with three input OR gate 706 (FIG. 6) to accommodate an additional connection from the output of gate 302.

In various embodiments, the error correction module 244 can use manufacturing error diagnosis and correction techniques, or design error diagnosis and correction (DEDC) techniques known in the art and described previously. For example, where a design error diagnosis and correction technique is used, the specification information (i.e., the original netlist 210 and differential test vectors 225), and the modified design (modified netlist 211) are used as input data. By using simulation and analysis techniques, the error correction algorithms can identify a comprehensive set of suggested modifications (corrections) for a set of differential test vectors 225 that highlight the logical discrepancies between the modified design and the original design.

Note that if the specification provided to the error correction module 244 is not exhaustive, logical differences may result between the original design and a corrected design. For example, it is often impractical for the set of differential test vectors 225 to be exhaustive due to time and memory requirements necessary to determine all possible vectors that make errors introduced by a modification of the target element observable. Note that in combination with the original test vectors, when a differential test vector is not included in the set of differential test vectors that the corrected netlist can not be guaranteed to be equivalent to the original netlist. In other words, if a specific error condition is unknown its correction cannot be guaranteed.

The set of corrections 235 in FIG. 2 represent the corrections identified by the error correction module 244. The set of corrections 235 contains logical corrections that may or may not meet or improve the undesirable characteristic. Depending upon the characteristic being optimized, a corrected netlist 212 can be identified by the designer. Since the differential test vectors act as part of the specification for the original design, it is possible for the error correction module to return a correction that is not logically equivalent to the original design if one or more differential test vectors are not considered. Therefore, a subsequent verification will generally need to be performed if the specification describing the failure, i.e. the differential test vectors in combination with some or all of the original test vectors, is not exhaustive.

The system verifier module 246 is used to verify the logical functionality of the corrected netlist 212. In one embodiment, the system verifier 246 includes a simulator, such as the simulator 501 described with reference to FIG. 5, to verify the logical functionality of the corrected netlist 212 based upon a set of test files. In this embodiment, the set of test files would include a set of verification vectors 614 that are specified by a user to indicate the functionality of a "good" device. For example, the original test vectors 220 and the differential test vector set 225 can be used. Note, in this embodiment, a specification to the error correction tool would not have included all of the original vectors, otherwise reverification by the original test vectors 220 would be redundant.

The system verifier 246 can also use a formal verification technique to verify equivalency of the corrected netlist 212 to the original netlist 210. Formal equivalency techniques deterministically verify the functional equivalency of two netlists based upon the netlist themselves, as opposed to relying on simulation results. Tools capable of performing formal equivalency verification are known in the art and include binary decision diagram (BDD) based techniques, satisfiability (SAT) based techniques, and ATPG based techniques. In addition, a novel verification method using an ATPG based technique discussed herein with reference to FIG. 7.

Figure 7:
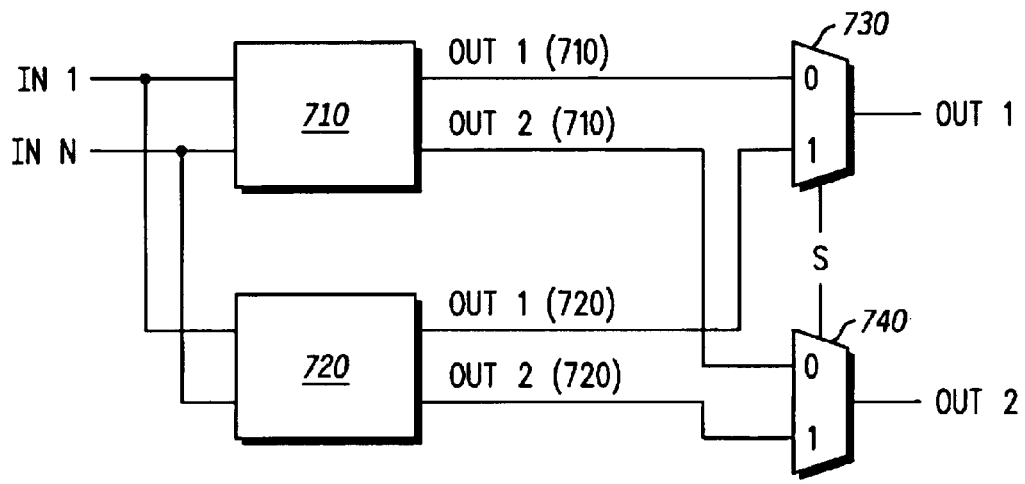
FIG. 7 illustrates, in block diagram form, a technique for verifying functionality of a device.

FIG. 7 illustrates a particular ATPG based technique for verifying logical equivalence of a design. Specifically, FIG. 7 illustrates two devices 710 and 720 that are believed to be logically equivalent. With respect to the disclosure herein, device 710 can represent the original design, and device 720 can represent the modified design. The two designs to be compared for equivalency are combined by coupling their outputs to respective input ports of a multiplexing device. For example, outputs OUT1(710) and OUT1(720) are outputs expected to provide logically equivalent results. These outputs are provided to data input ports of multiplexor 730 that can be independently selected. If the functionality of the two outputs are equivalent, the logic states observed at the output of the multiplexor will be the same regardless of the state value of the select signal S. Conversely, if at any point in time there is a different state on the inputs of the multiplexor 730, then the output value of the multiplexor 730 will be dependent upon the state of the select line. Using an ATPG algorithm to perform a stuck at analysis of the select node S provides for an efficient method of determining whether the designs 710 and 720 are equivalent. For example, if the stuck at analysis indicates that the select node S is not observable, then the designs are equivalent (i.e., input values always the same). However, if the stuck at analysis indicates that the select node S is observable, then there is a test vector for which the inputs to the multiplexor 710 are different, indicating non-equivalency.

Figure 8:
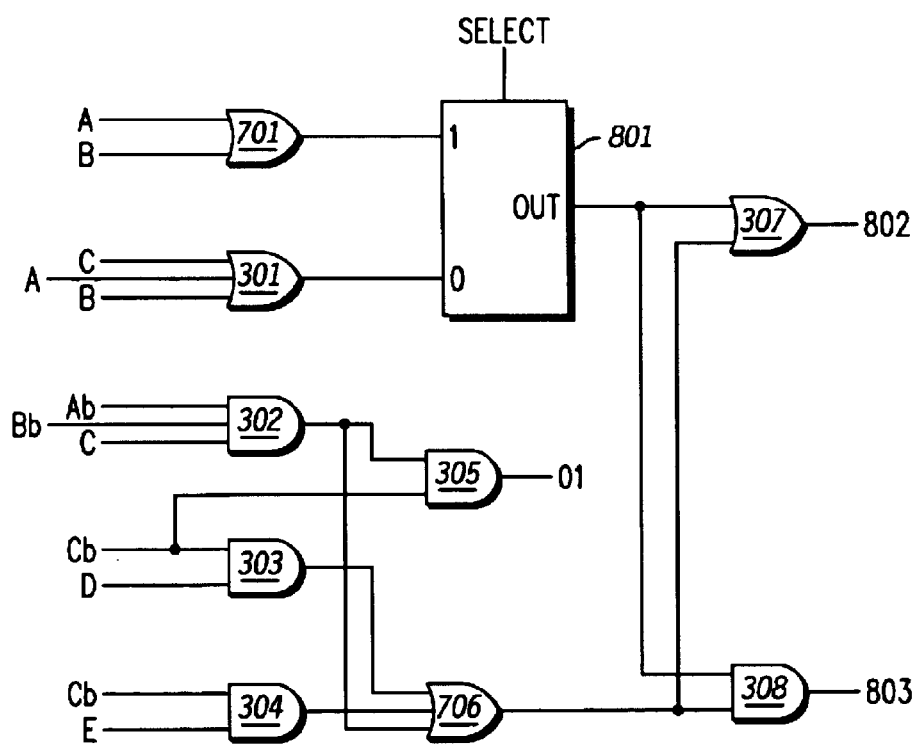
FIG. 8 illustrates, in block diagram form, a technique for identifying differential test vectors for a device in accordance with the present invention.

FIG. 8 indicates a novel method of using a multiplexing device to generate the differential test vectors 225. FIG. 8 illustrates a circuit that is a combination of the modified netlist of FIG. 4 and the original netlist of FIG. 3, that takes advantage of the fact that the location of the introduced error is known. Specifically, the netlist of FIG. 8 represents a modified netlist whereby a first input to multiplexor 801 is coupled to the output of the original gate 301, which includes the target wire, and a second input to multiplexor 801 is coupled to the output of the modified gate 701, which has the target wire removed. By using an ATPG algorithm to perform a stuck at analysis at the select node S of the multiplexor 801, an observable set of differential test vectors can be identified. Specifically, the ATPG algorithm will identify those test vectors which generate different state values at the inputs to the multiplexor 801 simultaneously. When different states values are present at the inputs of the multiplexor 801, a logical difference between the target device and the modified target device has been identified. Therefore, a differential test vector is a vector that highlights a difference between the original and modified design.

Figure 9:
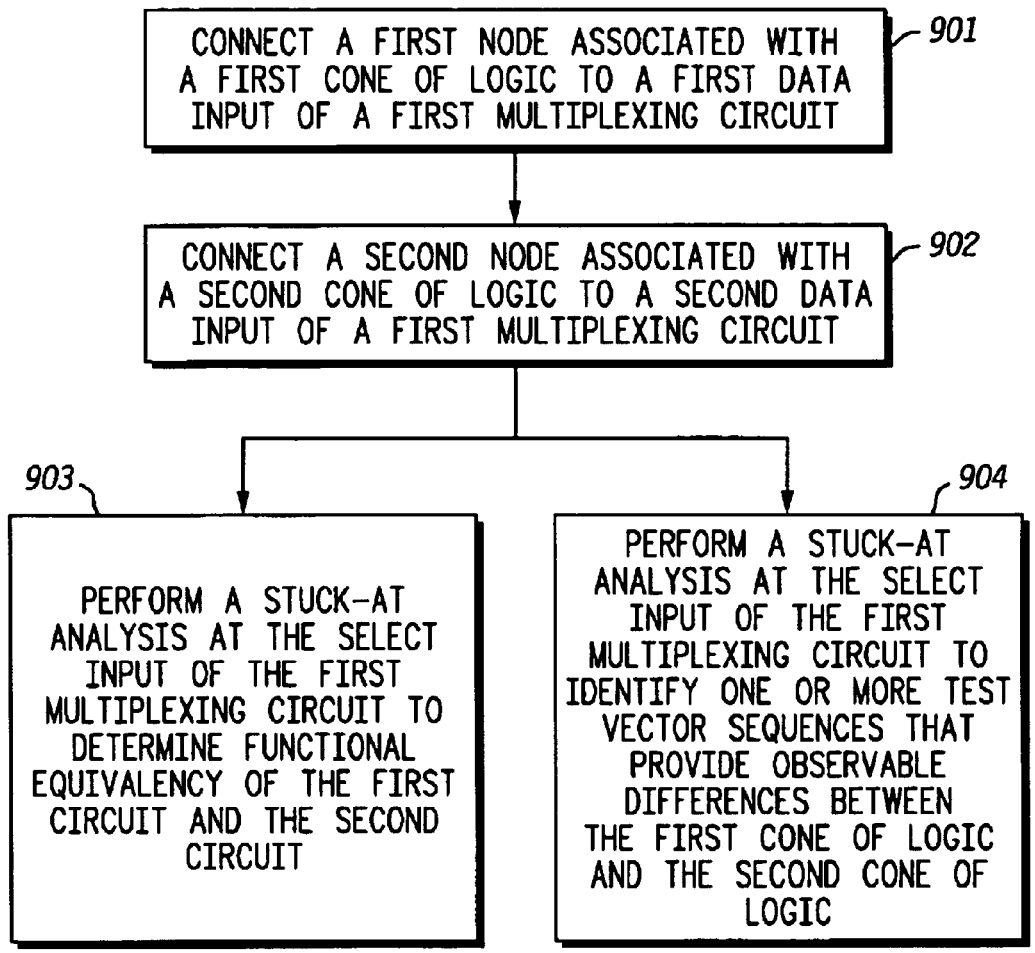
FIG. 9 illustrates a method for verifying, or generating test vectors for a design in accordance with the present invention.

FIG. 9 illustrates a method in accordance with a specific embodiment of the present invention that reflects the use of a multiplexing device to generate differential test vectors or to verify equivalency of logic devices.

At step 901, a first node associated with a first cone of logic is connected to a first data input of a multiplexing device. With respect to FIG. 8, the first cone of logic includes gate 701 and the logic elements, if any, that contribute the output state of gate 701.

At step 902, a second node associated with a second cone of logic is connected to a second data input of a multiplexing device. With respect to FIG. 8, the second cone of logic includes gate 301 and the logic elements, if any, that contribute the output state of gate 301.

When a logic verification is to be performed, the flow of FIG. 9 will proceed to step 903. At step 903, a stuck at analysis at the select input S of the multiplexor is performed to determine functional equivalency of the first cone of logic to the second cone of logic. As previously discussed, if the state of input S is not observable, then equivalency exists. Equivalency for an entire device can be determined by performing single stuck at analysis at the select node S, which controls a plurality of multiplexors that have a common node S. For example, see FIG. 7, which illustrates a common select line S controlling multiplexor 701 and 740. This method of design equivalency check is more efficient than other equivalency checkers which perform stuck at analysis on each individual outputs as opposed to one stuck at analysis at the control node.

When a set of differential test vectors that sensitize the differences between first and second cone of logic is needed the flow of FIG. 9 proceeds to step 904. At step 904, a stuck at analysis at the select input S of the multiplexor is performed. Because the multiplexing circuit allows valid data to propagate past the cone of logic to the primary outputs, the ATPG tool will identify different test vectors that are observable at primary outputs.

It will be appreciated that the methods disclosed herein are improvements over the prior art, in that the present methods facilitate diagnosis and correction by implementing errors in a known location. Further more, specific implementations are not limited to finding corrections that are redundant to the target element. For example, the correction introduced in FIG. 6 is not redundant with the original netlist represented in FIG. 4 and it cannot be found using prior art manufacturing error diagnosis and correction tools. Specifically, if the target element is put back in FIG. 6, i.e. the gate 701 is replaced with the gate 301 of the original design, a different logic state is obtained at the primary outputs for the single line test vector (A,B,C,D,E)=(0,0,1,0,0). In contrast, a redundant correction would provide the same logic state at the primary outputs when the target element is still present. The ability to identify non-redundant corrections is an advantage over the prior art, which adds redundant logic prior to removing the target element, in that more options for optimizing a design are available. In addition, prior art techniques have been developed around the removal of a single wire as target element. Since the presented approach formulates the problem around the replacement of the target element, it is not limited by the amount or type of target element it can eliminate.

It should be understood that the specific steps indicated in the methods herein, and/or the functions of specific modules herein, may be implemented in hardware and/or software. For example, a specific step or function may be performed using software and/or firmware executed on one or more a processing modules. For example, the components 242, 244, and 246, may actually be components implemented in software, where the various inputs to any one module are implemented using software controlled accesses to memory where the various netlists and test vectors reside.

In general, a system for performing design optimization or verification may include a generic processing module and memory. The processing module can be a single processing device or a plurality of processing devices. Such a processing device may be a microprocessor, microcontroller, digital processor, microcomputer, a portion of a central processing unit, a state machine, logic circuitry, and/or any device that manipulates the signal.

The manipulation of these signals is generally based upon operational instructions represented in a memory. The memory may be a single memory device or a plurality of memory devices. Such a memory device may be a read only memory, a random access memory, a floppy disk memory, magnetic tape memory, erasable memory, a portion of a system memory, and/or any device that stores operational instructions in a digital format. Note that when the processing module implements one or more of its functions, it may do so where the memory storing in the corresponding operational instructions is embedded within the circuitry comprising a state machine and/or other logic circuitry.

Figure 10:
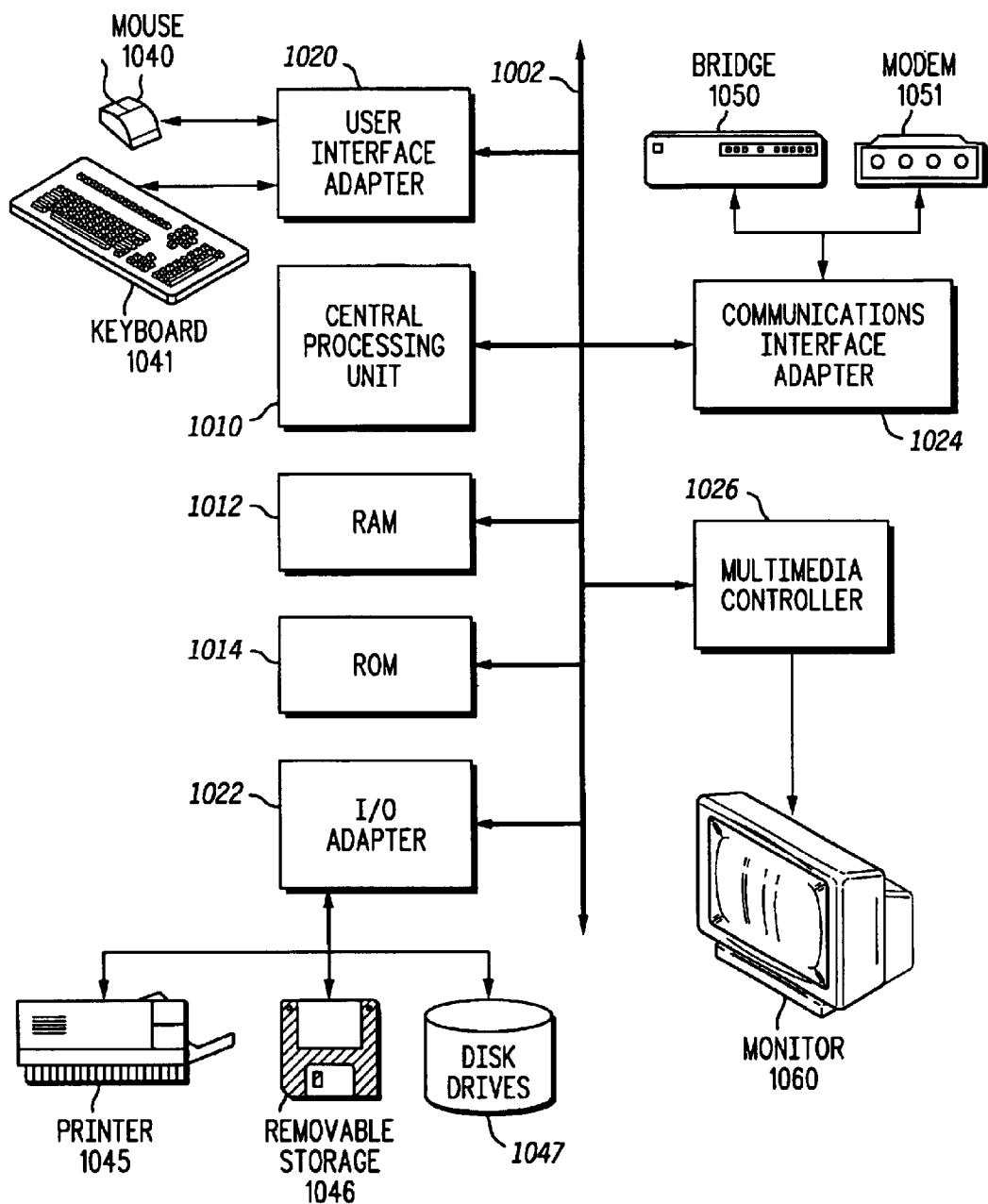
FIG. 10 illustrates a data processing system capable of implementing one or more aspects of the present invention.

FIG. 10 illustrates, in block diagram form, a processing device in the form of a computer system 1000. The computer system 1000 is illustrated to include: a central processing unit 1010, which may be a conventional or proprietary data processor; memory, including random access memory 1012, and read only memory 1014; input output adapter 1022, a user interface adapter 1020, a communications interface adapter 1024, and a multimedia controller 1026.

The input output (I/O) adapter 1026 is further connected to, and controls, disk drives 1047, printer 1045, removable storage devices 1046, as well as other standard and proprietary I/O devices.

The user interface adapter 1020 can be considered to be a specialized I/O adapter. The adapter 1020 is illustrated to be connected to a mouse 1040, and a keyboard 1041. In addition, the user interface adapter 1020 may be connected to other devices capable of providing various types of user control, such as touch screen devices.

The communications interface adapter 1024 is connected to a bridge 1050 such as is associated with a local or a wide area network, and a modem 1051. By connecting the system bus 1002 to various communication devices, external access to information can be obtained.

The multimedia controller 1026 will generally include a video graphics controller capable of displaying images upon the monitor 1060, as well as providing audio to external components (not illustrated).

It will be appreciated that, the system 1000 will be capable of implementing the system and methods described herein through the use of operational instructions.

In the foregoing specification, the invention has been described with reference to specific embodiments. However, one of ordinary skill in the art appreciates that various modifications and changes can be made without departing from the scope of the present invention as set forth in the claims below. For example, a simple target element has been used to describe the present invention. However, the techniques described are readily extendable to target elements that represent one or more logical components. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method comprising:
   modifying an element in a first design representation to create a second design representation, wherein the first design representation represents a first circuit having a first logic function and the second design representation represents a second circuit having a second logic function different than the first logic function;
   determining a first test vector to sensitize a logical difference between the first design representation and the second design representation; and
   determining a set of corrections based on the first test vector, wherein a correction within the set of corrections identifies a modified design representation logically the same as the first circuit for the first test vector.

2. The method of claim 1, wherein determining the first test vector includes the logical difference being observable at a primary output of the first circuit and the second circuit.

3. The method of claim 1 further comprising:
   applying a first correction from the set of corrections to the second design representation to form a third design representation.

4. The method of claim 1, wherein modifying the element includes one of removing the element or replacing the element with one or more different elements.

5. The method of claim 4, wherein the element is associated with a portion of the first design representation having an undesirable design characteristic.

6. The method of claim 5, wherein the undesirable design characteristic is a propagation delay.

7. The method of claim 5, wherein the undesirable design characteristic is a race condition.

8. The method of claim 5, wherein the undesirable design characteristic is power consumption.

9. The method of claim 5, wherein the undesirable design characteristic is noise consumption.

10. The method of claim 5, wherein the undesirable design characteristic is low testability.

11. The method of claim 10, further comprising:
    creating a third design representation having a multiplexing device, wherein a first input of the multiplexing device is to receive data based on at least a portion of the first logic function, and the second input of the multiplexing function is to receive data based on at least a portion of the second logic function; and
    wherein determining the first test vector includes performing a stuck-at analysis of a select line of the multiplexing device.

12. The method of claim 1, wherein determining the first test vector includes using an automatic test program generator (ATPG) based program.

13. The method of claim 1, wherein:
    determining a first test vector includes determining a plurality of test vectors to sensitize a logical difference between the first design representation and the second design representation, and
    determining the set of corrections includes determining a non-redundant correction based on the plurality of test vectors.

14. A method comprising:
    determining a first test vector to sensitize a functionality difference between a first portion of a first design representation and a second portion of the first design representation; and
    determining a design representation modification based upon the first test vector, wherein the design representation modification is to be used in a device instead of the first portion and the second portion to provide a desired logical functionality.

15. The method of claim 14, wherein the desired logical functionality is the same as a logical functionality for the first portion.

16. The method of claim 14, wherein the design representation modification is different than the first portion of the design representation and the second portion of the design representation.

17. The method of claim 14, wherein determining the first test vector includes the first test vector sensitizing the functionality difference at a primary output of a device.

18. A system comprising:
a differential test vector generator having a first input to access a first design representation, a second input to access a second design representation, and an output to provide a test vector that sensitizes a logical difference between at least a portion of the first design representation and at least a portion of the second design representation; and
a error correction module having a first input coupled to access the first design representation, a second input coupled to access the second design representation, a third input coupled to the output of the differential test vector generator, and an output to provide a third design representation that is logically equivalent to the first design representation based on the test vector.

19. The system of claim 18 further comprising:
a system verifier having a first input to receive the first design representation and a second input to receive the second design representation, and an output to provide an indication that the first design is functionally equivalent.

20. The system of claim 19, wherein the system verifier performs a formal verification.

21. The system of claim 20, wherein the system verifier includes one of an automatic test program generator portion, a binary decision diagram portion, and satisfaction (SAT) solver.

22. A system comprising:
a processing module; and
memory operably coupled to the processing module, wherein the memory stores operational instructions that cause the processing module to:
access a design representation having a first portion and a second portion;
determine a test vector to sensitize a logical difference between the first portion and a second portion; and
determine a design representation modification based upon the test vector, wherein the design representation modification is to provide a desired functionality in place of the first portion and the second portion.

23. The system of claim 22, wherein the operational instructions that determine the test vector includes the test vector sensitizing the logical difference in an observable manner at primary outputs of the design representation.

24. A computer readable medium for storing a data processing routine comprising:
determining a test vector to sensitize a functionality difference between a first portion of a first design representation and a second portion of the first design representation; and
determining a design representation modification based upon the test vector, wherein the design representation modification is to replace the first portion and the second portion to provide a desired logical functionality.

25. The computer readable medium of claim 24, wherein determining the test vector includes the test vector sensitizing the functionality difference in an observable manner at primary outputs of the first design representation.

26. A method comprising:
coupling a first node to a first data input of a first multiplexing circuit, wherein the functionality of the first node is based upon a first circuit;
coupling a second node to a second data input of the first multiplexing circuit, wherein the functionality of the second node is based upon a second circuit; and
performing a stuck-at analysis at a select input of the first multiplexing circuit to determine logical equivalency of the first circuit and the second circuit.

27. The method of claim 26, wherein performing the stuck-at analysis includes using an automatic test program generator to perform the stuck-at analysis at the select input.

28. The method of claim 26 further comprising:
coupling a third node to a first data input of a second multiplexing circuit, wherein the functionality of the third node is based upon a third circuit;
coupling a fourth node to a second data input of a second multiplexing circuit, wherein the functionality of the fourth node is based upon a fourth circuit; and
coupling a select node to the select input of the first multiplexing circuit and to a select input of the second multiplexing circuit.

29. The method of claim 28, wherein the first circuit and third circuit are part of a first device and the second circuit and fourth circuit are part of a second device.

30. The method of claim 28, wherein the first node and third node are primary outputs of the first device and the second node and third node are primary outputs of the second device.

31. The method of claim 26, wherein the first node and the second node provide data internal to the first device.

32. A method comprising:
coupling a first node to a first data input of a first multiplexing circuit, wherein the functionality of the first node is based upon a first circuit;
coupling a second node to a second data input of the first multiplexing circuit, wherein the functionality of the second node is based upon a second circuit; and
performing a stuck-at analysis at the select input of the first multiplexing circuit to determine a set of test vectors to sensitize logical differences between the first circuit and the second circuit.

33. The method of claim 32, wherein performing the stuck-at analysis includes using an automatic test program generator to perform the stuck-at analysis at the select input.

34. The method of claim 32, wherein the first circuit and second circuit are part of a common device.

35. The method of claim 33, wherein the logical differences are observable at primary outputs of the common device.

* * * * *